(12) United States Patent
Kim et al.

(10) Patent No.: US 12,009,393 B2
(45) Date of Patent: Jun. 11, 2024

(54) TUNNEL FIELD EFFECT TRANSISTOR AND TERNARY INVERTER COMPRISING SAME

(71) Applicant: UNIST(ULSAN NATIONAL INSTITUTE OF SCIENCE AND TECHNOLOGY), Ulsan (KR)

(72) Inventors: Kyung Rok Kim, Ulsan (KR); Ji Won Chang, Ulsan (KR); Jae Won Jeong, Ulsan (KR); Youngeun Choi, Ulsan (KR); Wooseok Kim, Ulsan (KR)

(73) Assignee: UNIST(ULSAN NATIONAL INSTITUTE OF SCIENCE AND TECHNOLOGY) (KR)

( * ) Notice: Subject to any disclaimer, the term of this patent is extended or adjusted under 35 U.S.C. 154(b) by 296 days.

(21) Appl. No.: 17/636,336

(22) PCT Filed: Nov. 19, 2020

(86) PCT No.: PCT/KR2020/016417
§ 371 (c)(1),
(2) Date: Feb. 17, 2022

(87) PCT Pub. No.: WO2021/137433
PCT Pub. Date: Jul. 8, 2021

(65) Prior Publication Data
US 2022/0344473 A1     Oct. 27, 2022

(30) Foreign Application Priority Data

Dec. 30, 2019 (KR) .................. 10-2019-0178519
Jul. 14, 2020 (KR) .................. 10-2020-0087153

(51) Int. Cl.
*H01L 29/10* (2006.01)
*H01L 27/092* (2006.01)
*H01L 29/78* (2006.01)

(52) U.S. Cl.
CPC ...... *H01L 29/1083* (2013.01); *H01L 27/0924* (2013.01); *H01L 29/7851* (2013.01)

(58) Field of Classification Search
CPC ............. H01L 29/1083; H01L 27/0924; H01L 29/7851; H01L 27/0727; H01L 29/885;
(Continued)

(56) References Cited

U.S. PATENT DOCUMENTS 9,455,346 B2 *  9/2016  Wu ..................... H01L 29/785
9,881,918 B1 *  1/2018  Huang ................. H01L 21/324
(Continued)

FOREIGN PATENT DOCUMENTS

KR      20060110702 A      10/2006
KR      20170093547 A      8/2017
(Continued)

OTHER PUBLICATIONS

International Search Report and Written Opinion for PCT/KR2020/016417, dated Feb. 25, 2021.
(Continued)

*Primary Examiner* — Karen Kusumakar
*Assistant Examiner* — Adam S Bowen
(74) *Attorney, Agent, or Firm* — Klarquist Sparkman, LLP

(57) ABSTRACT

A tunnel field effect transistor includes a constant current formation layer, a source region and a drain region provided on the constant current formation layer, a channel layer provided between the source region and the drain region, a gate electrode provided on the channel layer, and a gate insulating film provided between the gate electrode and the channel layer, wherein the source region and the drain region have different conductivity types, and the constant current formation layer forms a constant current between the drain region and the constant current formation layer.

20 Claims, 11 Drawing Sheets

(58) Field of Classification Search
CPC . H01L 29/107; H01L 29/785; H01L 29/7391; H03K 19/09425
See application file for complete search history.

(56) References Cited

U.S. PATENT DOCUMENTS

| | | | |
|---|---|---|---|
| 10,109,746 | B2 | 10/2018 | Lee et al. |
| 10,157,995 | B2* | 12/2018 | Wang ................ H01L 21/28518 |
| 10,198,023 | B2 | 2/2019 | Yoshino et al. |
| 10,840,347 | B2 | 11/2020 | Park et al. |
| 2006/0240622 | A1 | 10/2006 | Lee et al. |
| 2014/0152343 | A1 | 6/2014 | Chang |
| 2015/0294879 | A1* | 10/2015 | Zhu ....................... H01L 29/785 438/692 |
| 2015/0295070 | A1* | 10/2015 | Zhu ................... H01L 29/66795 257/192 |
| 2015/0303192 | A1* | 10/2015 | Zhu ....................... H01L 29/161 438/283 |
| 2015/0303274 | A1* | 10/2015 | Zhu ..................... H01L 29/6681 438/283 |
| 2015/0311123 | A1* | 10/2015 | Zhu ................... H01L 29/66545 438/283 |
| 2015/0318349 | A1* | 11/2015 | Zhu ....................... H01L 29/401 257/397 |
| 2015/0318396 | A1* | 11/2015 | Zhu ................... H01L 21/31111 257/192 |
| 2015/0318397 | A1* | 11/2015 | Zhu ................... H01L 29/66795 257/192 |
| 2015/0325699 | A1* | 11/2015 | Zhu ................... H01L 29/66795 257/192 |
| 2017/0012100 | A1* | 1/2017 | Leobandung ... H01L 21/823481 |
| 2018/0337173 | A1* | 11/2018 | Tsai ................... H01L 29/66803 |
| 2019/0165143 | A1* | 5/2019 | More ................ H01L 29/66492 |
| 2019/0386118 | A1* | 12/2019 | Chan ................... H01L 29/7834 |

FOREIGN PATENT DOCUMENTS

| | | |
|---|---|---|
| KR | 20180111690 A | 10/2018 |
| KR | 20180135350 A | 12/2018 |

OTHER PUBLICATIONS

Jeong, J. et al.* "Tunnelling-based ternary metal-oxide-semiconductor technology," *Natural Electronics*, 2:307-312 (Jul. 2019).

Notice of Allowance for Korean Patent Application No. 10-2020-0087153, dated Nov. 23, 2021 (w/English translation).

* cited by examiner

TUNNEL FIELD EFFECT TRANSISTOR AND TERNARY INVERTER COMPRISING SAME

CROSS REFERENCE TO RELATED APPLICATIONS

This is the U.S. National Stage of International Application No. PCT/KR2020/016417, filed Nov. 19, 2020, which in turn claims priority to Korean Patent Application No. 10-2019-0178519, filed Dec. 30, 2019, and Korean Patent Application No. 10-2020-0087153, filed Jul. 14, 2020, which applications are incorporated herein in their entireties.

TECHNICAL FIELD

The present disclosure relates to a project entitled "advanced concept ternary CMOS device technology and power-saving neural network standard cell implementation for peta-level connection" funded by Samsung Electronics Co., Ltd. under the project identification no. SRFC-TA1703-07.

The present disclosure relates to a tunnel field effect transistor and a ternary inverter.

BACKGROUND ART

The digital systems based on the binary logic in related arts have focused on increasing the bit density through miniaturization of complementary metal oxide semiconductor (CMOS) devices to process a large volume of data faster. However, the recent tendency of integration less than or equal to 30-nm has posed limitation on the increase of bit density due to the generation of leakage currents and the increase in power consumption caused by the quantum tunneling effect. To overcome such limitation on the bit density, there has been a growing interest in ternary logic devices and circuits, which are based on the multi-valued logic, and in particular, a standard ternary inverter (STI) has been actively developed as a standard unit for implementing the ternary logic. However, unlike the conventional binary inverters using one voltage source and two CMOSs, the existing technologies regarding the STI require more voltage sources or more complex circuit configuration.

DESCRIPTION OF EMBODIMENTS

Technical Problem

The present disclosure aims to provide a tunnel field effect transistor having a constant current.

The present disclosure aims to provide a ternary inverter having a constant current.

However, the technical objectives of the present disclosure are not limited thereto.

Solution to Problem

According to an aspect of an embodiment, a tunnel field effect transistor includes: a constant current formation layer; a source region and a drain region provided on the constant current formation layer; a channel layer provided between the source region and the drain region; a gate electrode provided on the channel layer; and a gate insulating film provided between the gate electrode and the channel layer, wherein the source region and the drain region have different conductivity types, and the constant current formation layer forms a constant current between the drain region and the constant current formation layer.

The constant current may be independent of a gate voltage applied to the gate electrode.

The constant current formation layer and the source region may have a first conductivity type, and the drain electrode may have a second conductivity type.

A doping concentration of the constant current formation layer may be higher than a doping concentration of the channel layer.

The doping concentration of the constant current formation layer a be greater than or equal to $3 \times 10^{18}$ cm$^{-3}$.

An electric field may be formed between the drain region and the constant current formation layer, and an intensity of the electric field may be greater than or equal to $10^6$ V/cm.

The constant current formation layer may be arranged adjacent to the drain region and be electrically connected to the drain region.

The constant current formation layer may extend to a region adjacent to the source region.

According to an aspect of an embodiment, a tunnel field effect transistor includes: a fin structure extending in a first direction; a gate electrode extending in a second direction intersecting with the first direction: and a gate insulting film provided between the fin structure and the gate electrode, wherein the fin structure includes a constant current formation layer provided at a lower portion of the fin structure, a source region and a drain region provided on the constant current formation layer, the source region and the drain region have different conductivity types, and the constant current formation layer forms a constant current between the drain region and the constant current formation layer.

The fin structure may overlap the gate electrode in the second direction.

The constant current may be independent of a gate voltage applied to the gate electrode.

The constant current formation layer and the source region may have a first conductivity type, and the drain electrode may have a second conductivity type.

The fin structure may further include a channel layer provided between the source region and the drain region, and a doping concentration of the constant current formation layer may be higher than a doping concentration of the channel layer.

The doping concentration of the constant current formation layer may be greater than or equal to $3 \times 10^{18}$ cm$^{-3}$.

An electric field may be formed between the drain region and the constant current formation layer, and an intensity of the electric field may be greater than or equal to $10^6$ V/cm.

The constant current formation layer may be arranged adjacent to the drain region and be electrically connected to the drain region.

The constant current formation layer may extend in the first direction, and overlap the source region and the drain region in a third direction intersecting with the first direction and the second direction.

According to an aspect of an embodiment, a ternary inverter includes: a first well region and a second well region; a first constant current formation layer and a second constant current formation layer provided on the first well region and the second well region, respectively; a first source region provided on the first constant current formation layer; a first channel layer; a first drain region, a second source region provided on the second constant current formation layer; a second channel region; a second drain region; and a first gate electrode and a second gate electrode provided on the first channel layer and the second channel layer, respectively, wherein the first source region and the first drain region have different conductivity types, the second source region and the second drain region have different conductivity types, the first constant current formation layer forms a first constant current between the first drain region and the first constant current formation layer, and the second constant current formation layer forms a second constant current between the second drain region and the second constant current formation layer.

Each of the first constant current and the second constant current may be independent of gate voltages applied to the first gate electrode and the second gate electrode, respectively.

The first constant current formation layer and the first source region may have the first conductivity type, the first drain electrode may have the second conductivity type different from the first conductivity type, the second constant current formation layer and the second source region may have the second conductivity type, and the second drain electrode may have the first conductivity type.

Advantageous Effects of Disclosure

Provided is a tunnel field effect transistor having a constant current.

Provided is a ternary inverter having a constant current.

However, the effects of the present disclosure are not limited thereto.

BEST MODE

Figure 1:
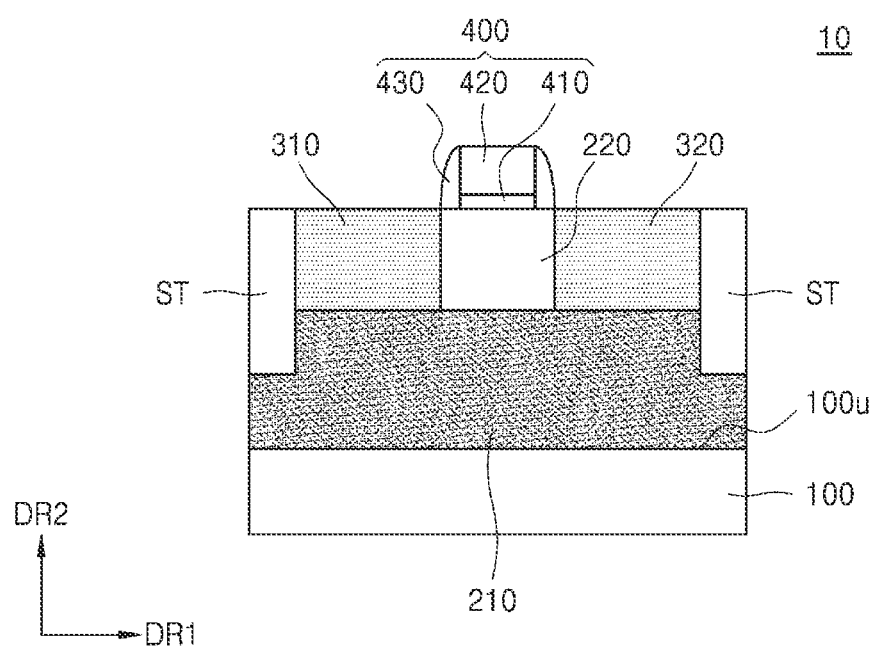
FIG. 1 is a cross-sectional view of a tunnel field effect transistor according to example embodiments.

According to an aspect of an embodiment, a tunnel field effect transistor includes: a constant current formation layer; a source region and a drain region provided on the constant current formation layer; a channel layer provided between the source region and the drain region; a gate electrode provided on the channel layer; and a gate insulating film provided between the gate electrode and the channel layer, wherein the source region and the drain region have different conductivity types, and the constant current formation layer forms a constant current between the drain region and the constant current formation layer.

According to an aspect of an embodiment, a tunnel field effect transistor includes: a fin structure extending in a first direction; a gate electrode extending in a second direction intersecting with the first direction; and a gate insulting film provided between the fin structure and the gate electrode, wherein the fin structure includes a constant current formation layer provided at a lower portion of the fin structure, a source region and a drain region provided on the constant current formation layer, the source region and the drain region have different conductivity types, and the constant current formation layer forms a constant current between the drain region and the constant current formation layer.

According to an aspect of an embodiment, a ternary inverter includes: a first well region and a second well region; a first constant current formation layer and a second constant current formation layer provided on the first well region and the second well region, respectively; a first source region provided on the first constant current formation layer; a first channel layer; a first drain region, a second source region provided on the second constant current formation layer; a second channel region; a second drain region; and a first gate electrode and a second gate electrode provided on the first channel layer and the second channel layer, respectively, wherein the first source region and the first drain region have different conductivity types, the second source region and the second drain region have different conductivity types, the first constant current formation layer forms a first constant current between the first drain region and the first constant current formation layer, and the second constant current formation layer forms a second constant current between the second drain region and the second constant current formation layer.

Mode of Disclosure

Hereinafter, embodiments will be described in detail with reference to the accompanying drawings. In the drawings, like reference numerals denote like elements, and sizes of elements may be exaggerated for clarity and convenience of explanation, Meanwhile, embodiments described below are provided merely as an example, and various modifications may be made from the embodiments.

When an element is "on" or "above" another element, it shall be understood that not only the element may be directly on another element, but also it may be on another element in a non-contact manner.

An expression used in the singular encompasses the expression of the plural, unless it has a clearly different meaning in the context. When a portion "includes" an element, another element may be further included, rather than excluding the existence of the other element, unless otherwise described.

In addition, the terms " . . . part," etc., described in the specification refer to a unit for processing at least one function or operation, which can be implemented by a hardware, a software, or a combination thereof.

FIG. 1 is a cross-sectional view of a tunnel field effect transistor according to example embodiments.

With reference to FIG. 1, a tunnel field effect transistor 10 may be provided. The tunnel field effect transistor 10 may include a substrate 100, a constant current formation layer 210, a pair of device isolation regions ST, a source region 310, a drain region 320, a channel layer 220, and a gate structure 400.

The substrate 100 may be a semiconductor substrate. For example, the substrate 100 may include silicon (Si). The substrate 100 may have a first conductivity type. For example, the first conductivity type may be n-type or p-type. When the conductivity type of the substrate 100 is n-type, the substrate 100 may include V group elements (e.g., P, As, etc.) as impurities. When the conductivity type of the substrate 100 is p-type, the substrate 100 may include III group elements (e.g., B, In, etc.) as impurities. Hereinafter, a region having n-conductivity type may include V group elements (e.g., P, As, etc.) as impurities, and a region having p-conductivity type may include III group elements (e.g., B, In, etc.) as impurities.

The constant current formation layer 210 may be provided on the substrate 100. For example, the constant current formation layer 210 may include silicon (Si). The constant current formation layer 210 may have the first conductivity type. A doping concentration of the constant current formation layer 210 may be higher than a doping concentration of the substrate 100. For example, the doping concentration of the constant current formation layer 210 may be greater than or equal to $3 \times 10^{18}$ cm$^{-3}$.

The source region 310 and the drain region 320 may be provided on the constant current formation layer 210. The source region 310 and the drain region 320 may be spaced apart from each other in the first direction DR1 parallel with an upper surface 100$u$ of the substrate 100. The source region 310 may have the first conductivity type. A doping concentration of the source region 310 may be higher than a doping concentration of the constant current formation layer 210. The drain region 320 may have a second conductivity type different from the first conductivity type. For example, when the first conductivity type is n-type, the second conductivity type may be p-type. Alternatively, when the first conductivity type is p-type, the second conductivity type may be n-type.

The source region 310 and the drain region 320 may be electrically connected to the constant current formation layer 210, For example, the source region 310 and the drain region 320 may be in direct contact with the constant current formation layer 210. An electric field may be formed between the constant current formation layer 210 and the drain region 320, For example, an intensity of the electric field may be greater than or equal to $10^6$ V/cm.

The channel layer 220 may be provided on the constant current formation layer 210. The channel layer 220 may be provided between the source region 310 and the drain region 320. The channel layer 220 may include a material substantially identical to that of the substrate 100. For example, the channel layer 220 may include silicon (SD. The channel layer 220 may have the first conductivity type. A doping concentration of the channel layer 220 may be substantially identical to a doping concentration of the substrate 100.

The pair of device isolation regions ST may be provided on the constant current formation layer 210. The pair of device isolation regions ST may be spaced apart from each other in the first direction DR1. The pair of device isolation regions ST may extend in a second direction DR2 perpendicular to the upper surface 100$u$ of the substrate 100. For example, a thickness of the pair of device isolation regions ST in the second direction DR2 may be greater than a thickness of the channel layer 220 in the second direction DR2. The pair of device isolation regions ST may include an electric insulator. For example, the pair of device isolation regions ST may include SiO$_2$ or a high dielectric material (e.g., SiON, HfO$_2$, and ZrO$_2$).

The gate structure 400 may be provided on the channel layer 220. The gate structure 400 may be provided between the source region 310 and the drain region 320 in a viewpoint of second direction DR2. In an embodiment, the gate structure 400 may partially overlap the source region 310 and the drain region 320 in the second direction DR2. The gate structure 400 may include a gate insulating film 410, a gate electrode 420, and a pair of spacers 430.

The gate electrode 420 may include an electrically conductive material. For example, the gate electrode 420 may include a doped semiconductor material, a metal, an alloy, or a combination thereof. For example, the gate electrode 420 may include doped polysilicon, tungsten (W) titanium nitride (TiN), or a combination thereof.

The gate insulating film 410 may be provided between the gate electrode 420 and the channel layer 220. The gate insulating film 410 may electrically insulate the gate electrode 420 and the channel layer 220 from each other. For example, the gate insulating film 410 may be in direct contact with an upper surface of the channel layer 220.

The gate insulating film 410 may be provided between the gate electrode 420 and the channel layer 220. For example, the gate insulating film 410 may be in direct contact with the channel layer 220 and the gate electrode 420. The gate insulating film 410 may have a material capable of implementing a desired capacitance. The gate insulating film 410 may include a material having a high permittivity. The high permittivity may refer to a permittivity higher than that of a silicon oxide. In one embodiment, a metallic oxide including at least one metal selected from Ca, Sr, Ba, Sc, Y, La, Ti, Zr, Nb, Ta, Ce, Pr, Nd, Gd, Dy, Yb, and Lu may be used for the gate insulating film 410. For example, the gate insulating film 410 may include HfO$_2$, ZrO$_2$, CeO$_2$, La$_2$O$_3$, Ta$_2$O$_3$, or TiO$_2$. The gate insulating film 410 may have a single-layer structure or a mufti-layer structure.

In one embodiment, a threshold voltage of the tunnel field effect transistor 10 may be adjusted according to a doping concentration of the substrate 100 and/or a work function of the gate electrode 420. For example, the work function of the gate electrode 420 may be adjusted by a material of the gate electrode 420 or an additional work function adjustment film (not shown). For example, the additional work function adjustment film may be arranged between the gate insulating film 410 and the substrate 100.

A channel may be formed by band-to-band tunneling occurring between the source region 310 and the channel layer 220. The occurrence of band-to-band tunneling may be adjusted by a gate voltage. The occurrence of band-to-band tunneling may be defined as an on-state of the tunnel field effect transistor 10. The non-occurrence of band-to-band tunneling may be defined as an off-state of the tunnel field effect transistor 10. When the tunnel field effect transistor 10 is an NMOS transistor, a conductivity type of the drain region 320 may be n-type. When the tunnel field effect transistor 10 is a PMOS transistor, a conductivity type of the drain region 320 may be p-type.

The constant current formation layer 210 may form a constant current between the drain region 320 and the constant current formation layer 210. The constant current may be a band-to-band tunneling (BTBT) current flowing between the drain region 320 and the constant current formation layer 210. The constant current may be independent of a gate voltage applied to the gate electrode 420. That is, the constant current may flow irrelevant to the gate voltage. When the tunnel field effect transistor 10 is an n-channel metal oxide semiconductor (NMOS) transistor, the constant current may flow from the drain region 320 to the substrate 100 through the constant current formation layer 210. When the tunnel field effect transistor 10 is a p-channel metal oxide semiconductor (PMOS) transistor, the constant current may flow from the substrate 100 to the drain region 320 through the constant current formation layer 210.

According to the present disclosure, the tunnel field effect transistor 10 in which a constant current is formed between the drain region 320 and the constant current formation layer 210 may be provided.

Figure 2:
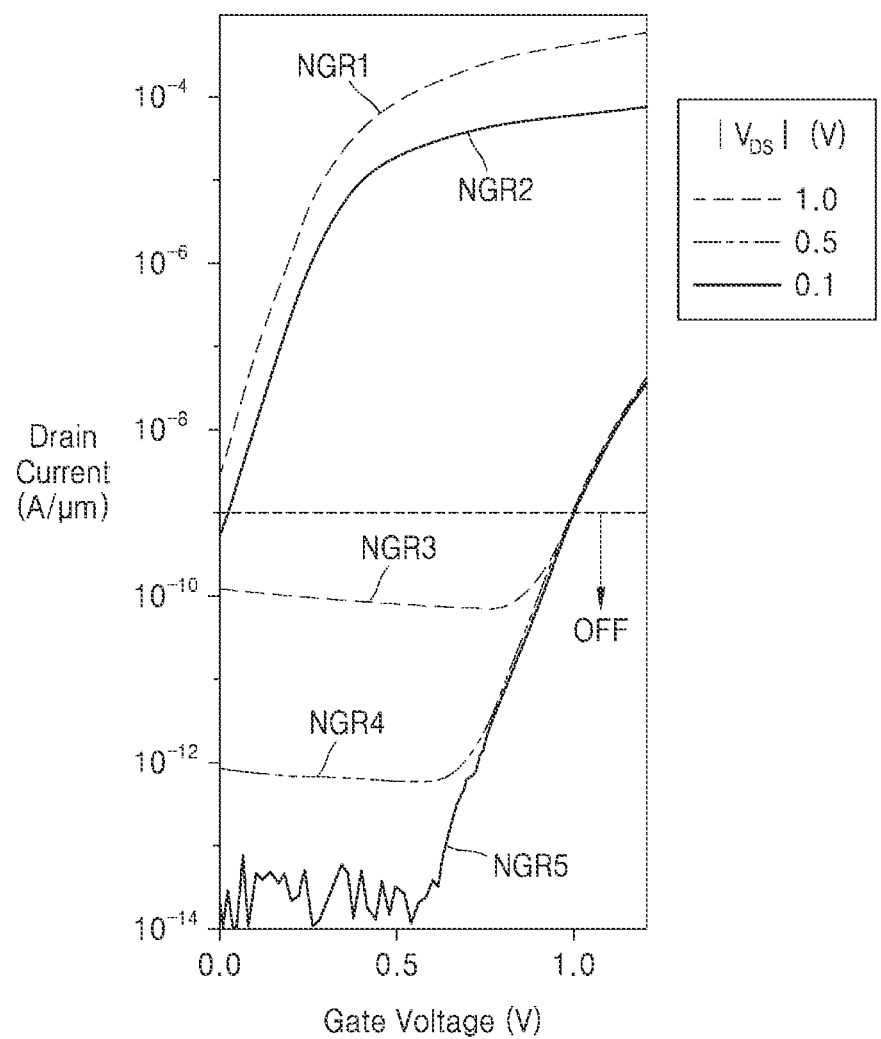
FIG. 2 shows graphs representing the relationship between a gate voltage and a drain current of n-channel metal oxide semiconductor (NMOS) transistors according to the present disclosure and conventional NMOS transistors.

FIG. 2 shows graphs representing the relationship between a gate voltage and a drain current of NMOS transistors according to the present disclosure and conventional NMOS transistors.

The gate voltage-drain current graphs of conventional NMOS transistors (NGR1 and NGR2), and the gate voltage-drain current graphs of NMOS transistors according to the present disclosure (NGR3, NGR4, and NGR5) are illustrated in FIG. 2.

The drain currents of the conventional NMOS transistors appeared not to have a constant current component flowing irrelevant to a gate voltage.

The drain currents of the NMOS transistors of the present disclosure appeared to have a constant current component flowing irrelevant to a gate voltage. For example, even when the NMOS transistors of the present disclosure are in an off-state, a constant current flows in the NMOS transistors of the present disclosure.

Figure 3:
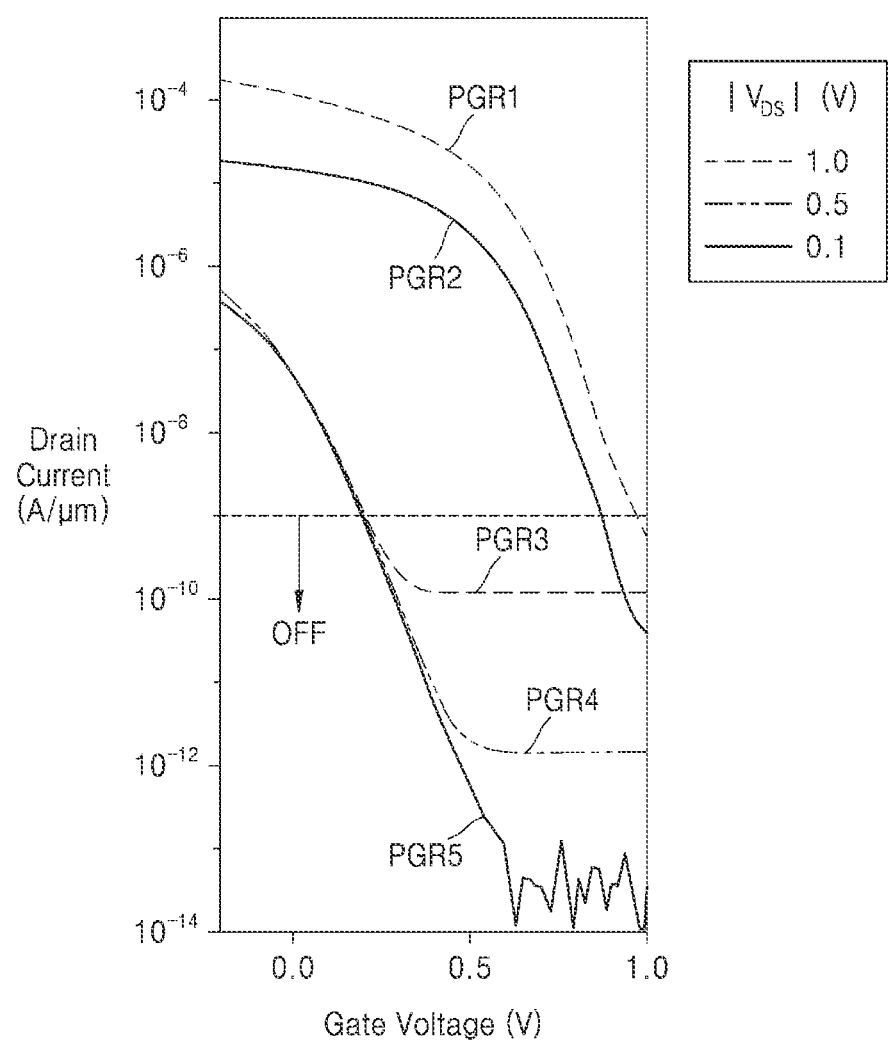
FIG. 3 shows graphs representing the relationship between a gate voltage and a drain current of p-channel metal oxide semiconductor (PMOS) transistors of the present disclosure and conventional PMOS transistors.

FIG. 3 shows graphs representing the relationship between a gate voltage and a drain current of PMOS transistors of the present disclosure and conventional PMOS transistors.

The gate voltage-drain current graphs of conventional PMOS transistors (PGR1 and PGR2), and the gate voltage-drain current graphs of PMOS transistors according to the present disclosure (PGR3, PGR4, and PGR5) are illustrated in FIG. 3.

The drain currents of the conventional PMOS transistors appeared not to have a constant current component flowing irrelevant to a gate voltage.

The drain currents of the PMOS transistors of the present disclosure appeared to have a constant current component flowing irrelevant to a gate voltage. For example, even when the PMOS transistors of the present disclosure are in an off-state, a constant current flows in the PMOS transistors of the present disclosure.

Figure 4:
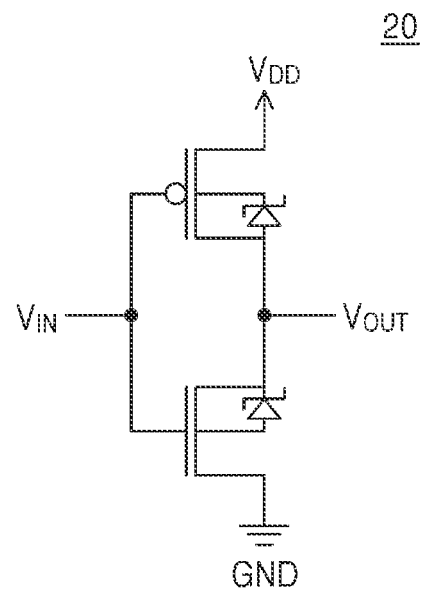
FIG. 4 is a circuit diagram of a ternary inverter according to example embodiments.

FIG. 4 is a circuit diagram of a ternary inverter according to example embodiments. For the sake of concise explanation, any description substantially identical to explanations made with reference to FIG. 1 may be omitted.

With reference to FIG. 4, a ternary inverter 20 including an NMOS transistor and a PMOS transistor may be provided. Each of the NMOS transistor and the PMOS transistor may be substantially identical to the tunnel field effect transistor 10 described with reference to FIG. 1. A conductivity type of the substrate 100, the constant current formation layer 210, the channel layer 220, and the source region 310 of the NMOS transistor may be p-type. A conductivity type of the drain region 320 of the NMOS transistor may be n-type. A conductivity type of the substrate 100, the constant current formation layer 210, the channel layer 220, and the source region 310 of the PMOS transistor may be n-type. A conductivity type of the drain region 320 of the PMOS transistor may be p-type.

A ground voltage may be applied to a source and a substrate of the NMOS transistor. For the sake of concise explanation, the ground voltage is assumed to be 0 volt (V) hereinafter. A driving voltage $V_{DD}$ may be applied to a source and a substrate of the PMOS transistor. An input voltage Vin may be applied to each of a gate electrode of the NMOS transistor and a gate electrode of the PMOS transistor.

A drain of the NMOS transistor and a drain of the PMOS transistor may be electrically connected to each other and thus may have the same voltage. The voltage of the drain of the NMOS transistor and the drain of the PMOS transistor may be an output voltage Vout of the ternary inverter 20.

A constant current may flow from the drain of the NMOS transistor to the substrate, A constant current may flow from the substrate of the PMOS transistor to the drain. The constant currents may be independent of the input voltage Vin.

In one embodiment, a first input voltage may be applied to the gate electrode of the PMOS transistor and the gate electrode of the NMOS transistor so that the PMOS transistor has a constant current predominant over a channel current, and the NMOS transistor has a channel current predominant over a constant current. At this time, the output voltage Vout of the ternary inverter 20 may be a first voltage.

In another embodiment, a second input voltage may be applied to the gate electrode of the PMOS transistor and the gate electrode of the NMOS transistor so that the NMOS transistor has a constant current predominant over a channel current, and the PMOS transistor has a channel current predominant over a constant current. At this time, the output voltage Vout of the ternary inverter 20 may be a second voltage greater than the first voltage.

In another embodiment, a third input voltage may be applied to the gate electrode of the PMOS transistor and the gate electrode of the NMOS transistor so that each of the NMOS transistor and the PMOS transistor has a constant current predominant over a channel current. At this time, the output voltage Vout of the ternary inverter 20 may be a third voltage between the first voltage and the second voltage.

A constant current flowing from the drain of the NMOS transistor to the substrate and a constant current flowing from the substrate of the PMOS transistor to the drain may flow irrelevant to the gate voltages applied to the gate electrodes of the PMOS transistor and the NMOS transistor. A current in the ternary inverter 20 may flow from the substrate of the PMOS transistor to the substrate of the NMOS transistor through the drain of the PMOS transistor and the drain of the NMOS transistor. The driving voltage $V_{DD}$ applied to the substrate of the PMOS transistor may be distributed to the resistance between the substrate and drain of the PMOS transistor and the resistance between the substrate and the drain of the NMOS transistor. The output voltage Vout may be a voltage applied to the resistance between the substrate of the NMOS transistor and the drain of the NMOS transistor. The output voltage Vout may have a value between the driving voltage $V_{DD}$ and 0 V.

The output voltage Vout may be 0 V ("0" state), a voltage between the driving voltage $V_{DD}$ and 0 V ("1" state), or the driving voltage $V_{DD}$ ("2" state) according to the input voltage Vin. According to the present disclosure, the ternary inverter 20 having three different states according to the input voltage Vin may be provided.

Figure 5:
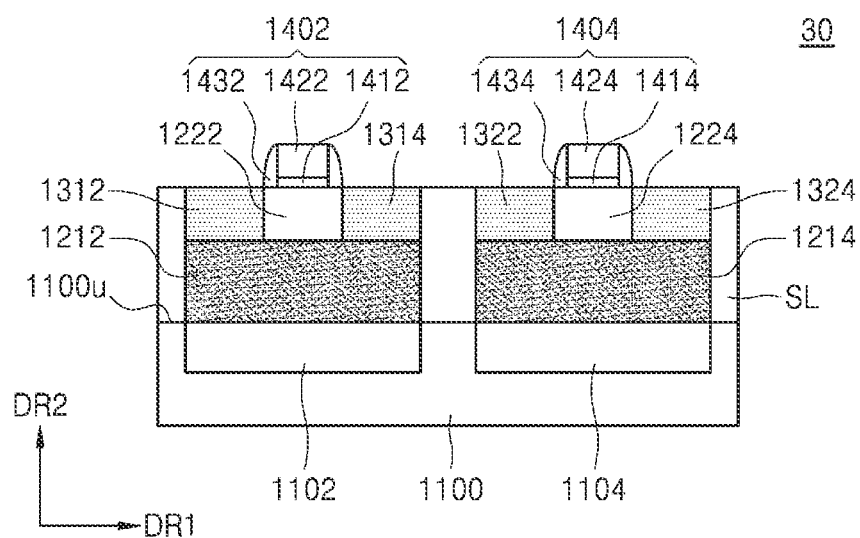
FIG. 5 is a cross-sectional view of a ternary inverter according to an example embodiment.

FIG. 5 is a cross-sectional view of a ternary inverter according to an example embodiment. For the sake of concise explanation, any description substantially identical to explanations made with reference to FIG. 1 may be omitted.

With reference to FIG. 5, a ternary inverter 30 may be provided. The ternary inverter 30 may include a substrate 1100, a first well region 1102, a second well region 1104, a device isolation film SL, a first constant current formation layer 1212, a second constant current formation layer 1214, a first channel layer 1222, a second channel layer 1224, a first source region 1312, a first drain region 1314, a second source region 1322, a second drain region 1324, a first gate structure 1402, and a second gate structure 1404.

The substrate 1100 may be a semiconductor substrate. For example, the substrate 1100 may include silicon (Si). The substrate 1100 may be an intrinsic semiconductor substrate or a semiconductor substrate having a conductivity type.

The first well region 1102 and the second well region 1104 may be provided at an upper portion of the substrate 1100. The first well region 1102 and the second well region 1104 may be spaced apart from each other in the first direction DR1 parallel with an upper surface 1100u of the substrate 1100. The first well region 1102 may be a p-type region. The second well region 1104 may be an n-type region.

The device isolation film SL exposing the first well region 1102 and the second well region 1104 may be provided on the substrate 1100. The device isolation film SL may include a material substantially identical to that of the pair of device isolation regions ST described with reference to FIG. 1.

The first constant current formation layer 1212 may be provided on the first well region 1102. For example, the first constant current formation layer 1212 may be an epitaxial layer. For example, the first constant current formation layer 1212 may include silicon (Si). A conductivity type of the first constant current formation layer 1212 may be substantially identical to a conductivity type of the first well region 1102. A conductivity type of the first constant current formation layer 1212 may be p-type. A doping concentration of the first constant current formation layer 1212 may be higher than a doping concentration of the first well region 1102. For example, the doping concentration of the first constant current formation layer 1212 may be greater than or equal to $3 \times 10^{18}$ cm$^{-3}$.

The second constant current formation layer 1214 may be provided on the second well region 1104. For example, the second constant current formation layer 1214 may be an epitaxial layer. For example, the second constant current formation layer 1214 may include silicon (Si). A conductivity type of the second constant current formation layer 1214 may be substantially identical to a conductivity type of the second well region 1104. A conductivity type of the second constant current formation layer 1214 may be n-type. A doping concentration of the second constant current formation layer 1214 may be higher than a doping concentration of the second well region 1104. For example, the doping concentration of the second constant current formation layer 1214 may be greater than or equal to $3 \times 10^{18}$ cm$^{-3}$.

The first channel layer 1222 may be provided on the first constant current formation layer 1212. For example, the first channel layer 1222 may be an epitaxial layer. For example, the first channel layer 1222 may include silicon (Si). A conductivity type of the first channel layer 1222 may be substantially identical to a conductivity type of the first constant current formation layer 1212. A conductivity type of the first channel layer 1222 may be p-type. A doping concentration of the first channel layer 1222 may be lower than a doping concentration of the first constant current formation layer 1212. For example, the doping concentration of the first channel layer 1222 may be substantially identical to a doping concentration of the first well region 1102.

The second channel layer 1224 may be provided on the second constant current formation layer 1214. For example, the second channel layer 1224 may be an epitaxial layer. For example, the second channel layer 1224 may include silicon (Si). A conductivity type of the second channel layer 1224 may be substantially identical to a conductivity type of the second constant current formation layer 1214. A conductivity type of the second channel layer 1224 may be n-type. A doping concentration of the second channel layer 1224 may be lower than a doping concentration of the second constant current formation layer 1214. For example, the doping concentration of the second channel layer 1224 may be substantially identical to a doping concentration of the second well region 1104.

The first source region 1312 and the first drain region 1314 may be provided on the first constant current formation layer 1212. The first source region 1312 and the first drain region 1314 may be spaced apart from each other in the first direction DR1 with the first channel layer 1222 therebetween. The first source region 1312 and the first constant current formation layer 1212 may have the same conductivity type. A conductivity type of the first source region 1312 may be p-type. A doping concentration of the first source region 1312 may be higher than a doping concentration of the first constant current formation layer 1212. The first drain region 1314 and the first constant current formation layer 1212 may have different conductivity types. A conductivity type of the first drain region 1314 may be n-type.

The second source region 1322 and the second drain region 1324 may be provided on the second constant current formation layer 1214. The second source region 1322 and the second drain region 1324 may be spaced apart from each other in the first direction DR1 with the second channel layer 1224 therebetween. The second source region 1322 and the second constant current formation layer 1214 may have the same conductivity type. A conductivity type of the second source region 1322 may be n-type. A doping concentration of the second source region 1322 may be higher than a doping concentration of the second constant current formation layer 1214. The second drain region 1324 and the second constant current formation layer 1214 may have different conductivity types. A conductivity type of the second drain region 1324 may be p-type.

The first gate structure 1402 may be provided on the first channel layer 1222. The first gate structure 1402 may include a first gate insulating film 1412, a first gate electrode 1422, and a first pair of spacers 1432. The first gate insulating film 1412, the first gate electrode 1422, and the first pair of spacers 1432 may be substantially identical to the gate insulating film 410, the gate electrode 420, and the pair of spacers 430 described with reference to FIG. 1, respectively.

The second gate structure 1404 may be provided on the second channel layer 1224. The second gate structure 1404 may include a second gate insulating film 1414, a second gate electrode 1424, and a second pair of spacers 1434. The second gate insulating film 1414, the second gate electrode 1424, and the second pair of spacers 1434 may be substantially identical to the gate insulating film 410, the gate electrode 420, and the pair of spacers 430 described with reference to FIG. 1, respectively.

According to the present disclosure, a ternary inverter 30 may be provided. The first well region 1102, the first constant current formation layer 1212, the first channel layer 1222, the first source region 1312, the first drain region 1314, and the first gate structure 1402 may constitute the NMOS transistor. The second well region 1104, the second constant current formation layer 1214, the second channel layer 1224, the second source region 1322, the second drain region 1324, and the second gate structure 1404 may constitute the PMOS transistor. The ground voltage may be applied to the first well region 1102 and the source of the NMOS transistor. The driving voltage may be applied to the second well region 1104 and the source of the PMOS transistor. The input voltage Vin may be applied to each of the first gate electrode 1432 of the NMOS transistor and the second gate electrode 1434 of the PMOS transistor.

The drain of the NMOS transistor (i.e., the first drain region 1314) and the drain of the PMOS transistor (i.e., the second drain region 1324) may be electrically connected to each other. The voltage of the drain of the NMOS transistor and the drain of the PMOS transistor may be an output voltage Vout of the ternary inverter 30. The descriptions on the ternary inverter may be substantially identical to the descriptions made with reference to FIG. 4.

Figure 6:
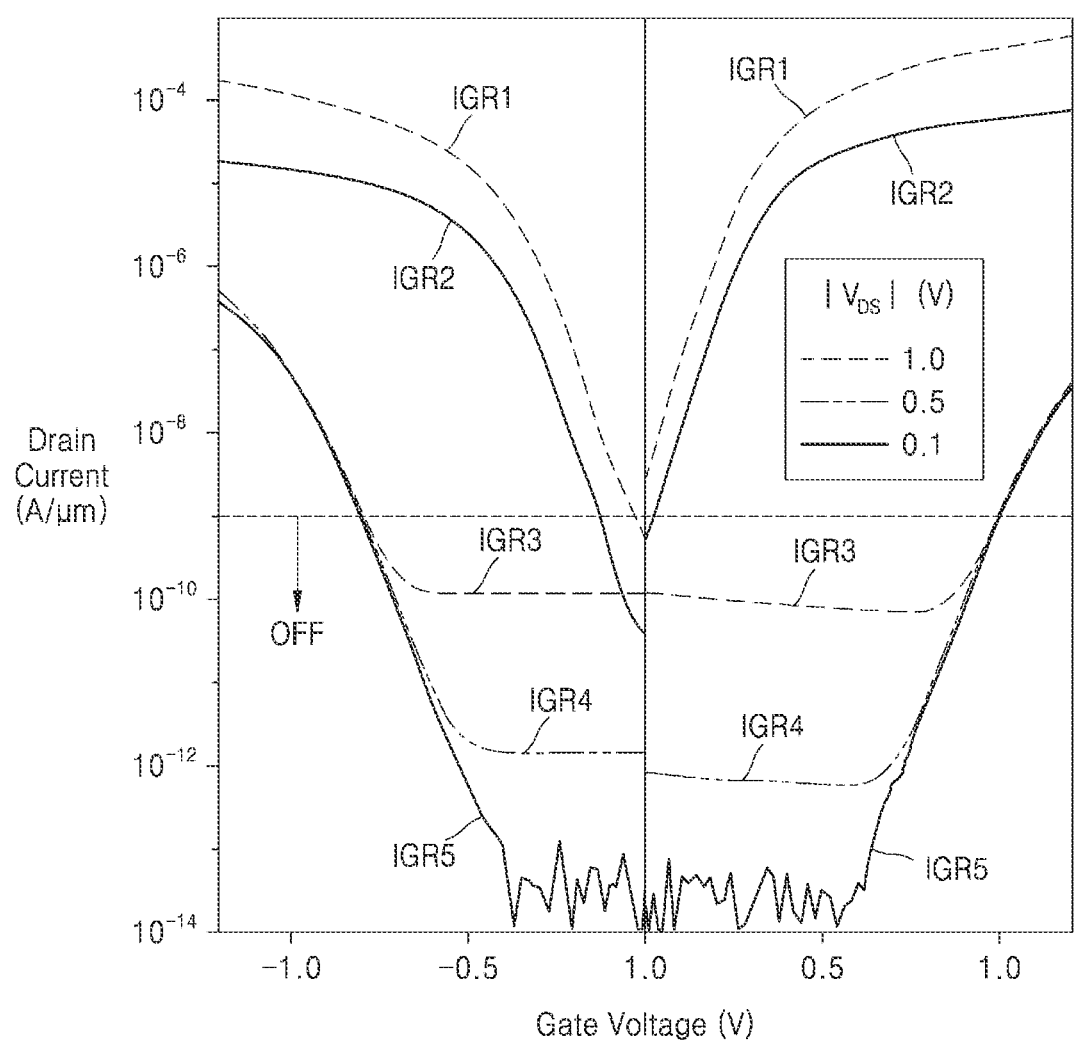
FIG. 6 shows graphs representing the relationship between a gate voltage and a drain current of binary inverters and ternary inverters of the present disclosure.

FIG. 6 shows graphs representing the relationship between a gate voltage and a drain current of binary inverters and ternary inverters of the present disclosure.

The gate voltage-drain current graphs of binary inverters (IGR1 and IGR2), and the gate voltage-drain current graphs of ternary inverters according to the present disclosure (IGR3, IGR4, and IGR5) are illustrated in FIG. 6.

The drain currents of the binary inverters appeared not to have a constant current component flowing irrelevant to a gate voltage.

The drain currents of the ternary inverters of the present disclosure appeared to have a constant current component flowing irrelevant to a gate voltage. For example, even when the ternary inverters of the present disclosure are in an off-state, a constant current flows in the ternary inverters of the present disclosure.

Figure 7:
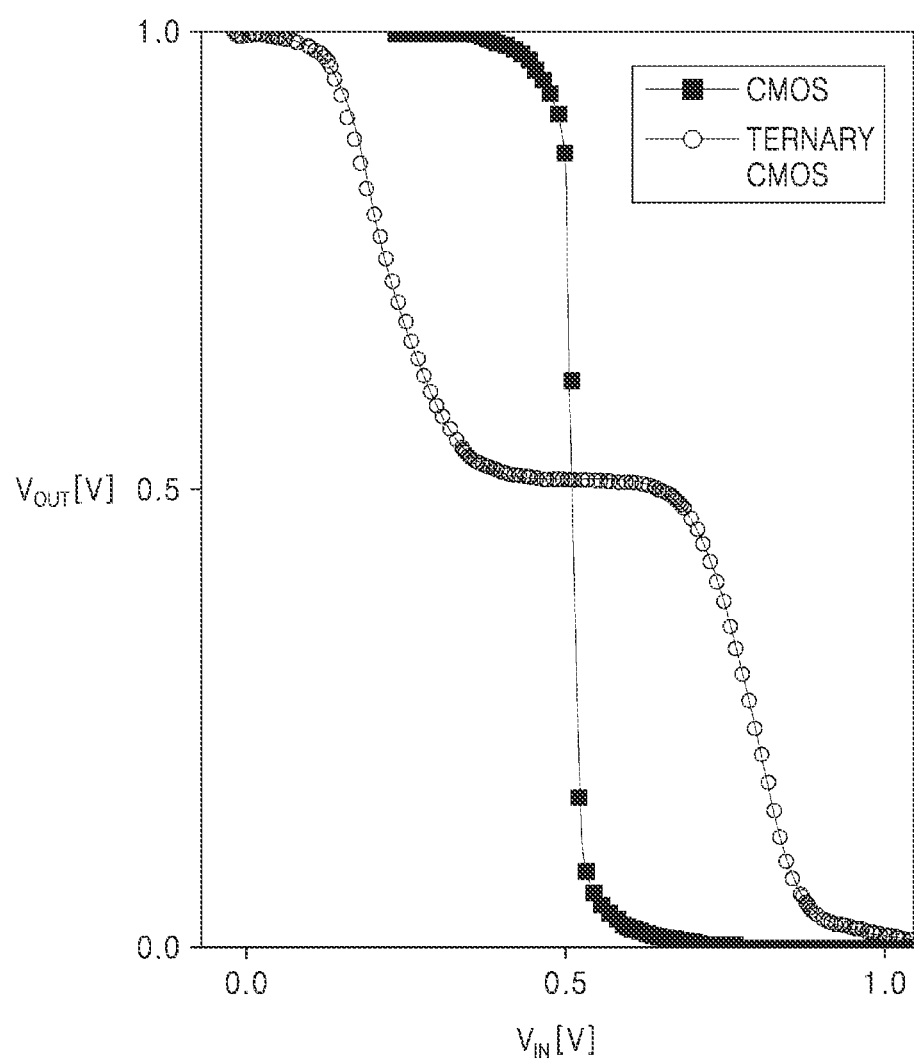
FIG. 7 shows graphs representing the relationship between an input voltage Vin and an output voltage Vout of binary inverters and ternary inverters of the present disclosure.

FIG. 7 shows graphs representing the relationship between an input voltage Vin and an output voltage Vout of binary inverter's and ternary inverters of the present disclosure.

With reference to FIG. 7, the driving voltage VDD of the binary inverter and the ternary inverter of the present disclosure is 1.0 V, and a ground voltage GND thereof is 0 V. The input voltage Vin of the ternary inverter and the binary inverter is 0 V to 1.0 V.

In the case of binary inverter, when the input voltage changes from 0 V to 1 V, the output voltage Vout is drastically decreased from 1 V to 0 V around the input voltage of 0.5 V. That is, the binary inverter has two different states (e.g., "0" state and "1" state).

In the case of ternary inverter, when the input voltages changes from 0 V to 1 V, the output voltage Vout is drastically decreased from 1 V to 0.5 V, then remains at 0.5 V, and finally, once again is drastically reduced from 0.5 V to 0 V. That is, the ternary inverter of the present disclosure has three different states (e.g., "0" state, "1" state, and "2" state).

Figure 8:
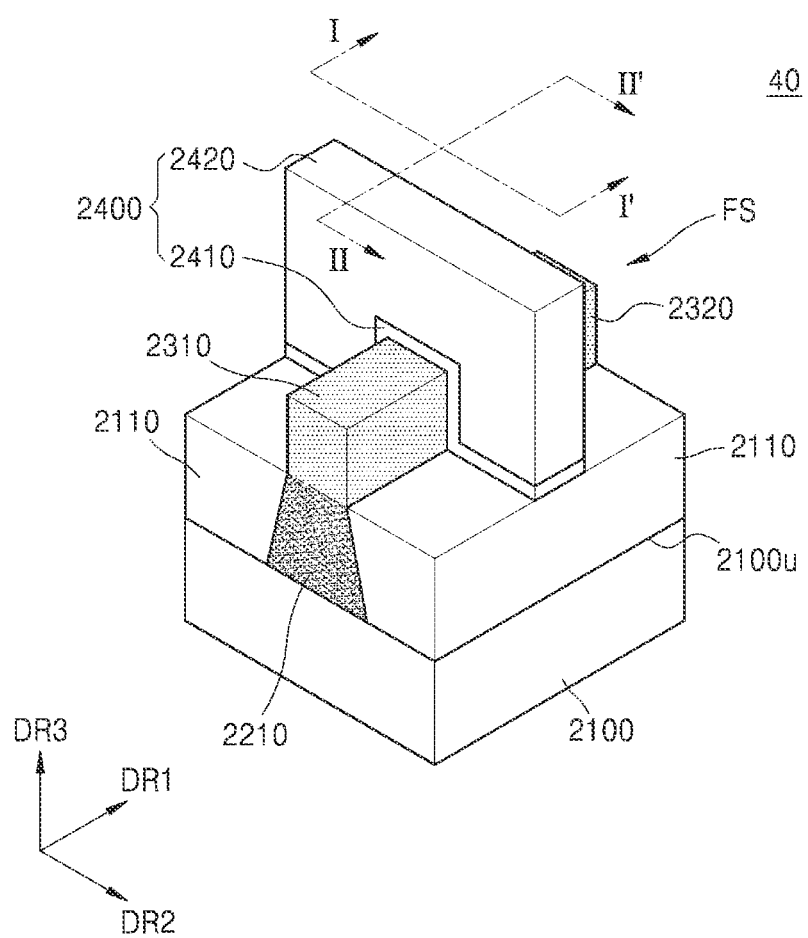
FIG. 8 is a perspective view of a tunnel field effect transistor according to an example embodiment.
Figure 9:
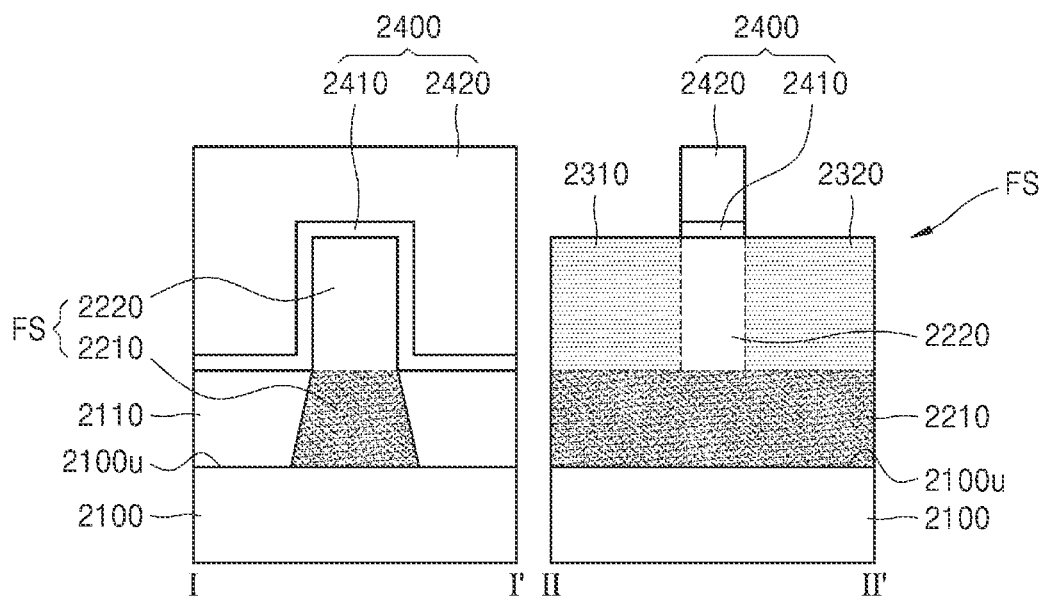
FIG. 9 are cross-sectional views taken along the I-I' line and the line in FIG. 11.

FIG. 8 is a perspective view of a tunnel field effect transistor according to an example embodiment. FIG. 9 are cross-sectional views taken along the line and the line in FIG. 8. For the sake of concise explanation, any description substantially identical to explanations made with reference to FIG. 1 may be omitted.

With reference to FIGS. 8 and 9, a tunnel field effect transistor 40 may be provided. The tunnel field effect transistor 40 may include a substrate 2100, a fin structure FS, a pair of lower insulating films 2110, and a gate structure 2400.

The substrate 2100 may be a semiconductor substrate. For example, the substrate 2100 may include silicon (Si). The substrate 2100 may have the first conductivity type. For example, the first conductivity type may be n-type or p-type.

The fin structure FS may be provided on the substrate 2100. The fin structure FS may extend in the first direction DR1 parallel with an upper surface 2100u of the substrate 2100. The fin structure FS may protrude from the upper surface 2100u of the substrate 2100. The fin structure FS may include a source region 2310, a drain region 2320, a channel layer 2220, and a constant current formation layer 2210.

The source region 2310 and the drain region 2320 spaced apart from each other in the first direction DR1 may be provided at an upper portion of the fin structure FS. The source region 2310 may have the first conductivity type. The drain region 2320 may have the second conductivity type different from the first conductivity type. When the first conductivity type is n-type, the second conductivity type may be p-type. When the first conductivity type is p-type, the second conductivity type may be n-type.

The channel layer 2220 may be provided at the upper portion of the fin structure FS. The channel layer 2220 may be provided between the source region 2310 and the drain region 2320. The channel layer 2220 may include a material substantially identical to that of the substrate 2100. For example, the channel layer 2220 may include silicon (Si), The channel layer 2220 may have the first conductivity type. A doping concentration of the channel layer 2220 may be substantially identical to a doping concentration of the substrate 2100.

The constant current formation layer 2210 may be provided at a lower portion of the fin structure FS. The constant current formation layer 2210 may extend in the first direction DR1. The constant current formation layer 2210 may overlap the source region 2310, the channel layer 2220, and the drain region 2320 in the third direction DR3. The constant current formation layer 2210 may be electrically connected to the source region 2310 and the drain region 2320. For example, the constant current formation layer 2210 may be in direct contact with bottom surfaces of the source region 2310 and the drain region 2320. The constant current formation layer 2210 may have the first conductivity type. A doping concentration of the constant current formation layer 2210 may be higher than a doping concentration of the substrate 2100 and the channel layer 2220. For example, the doping concentration of the constant current formation layer 2210 may be greater than or equal to $3 \times 10^{18}$ $cm^{-3}$. A doping concentration of the constant current formation layer 2210 may be lower than a doping concentration of the source region 2310. An electric field may be formed between the constant current formation layer 2210 and the drain region 2320. For example, an intensity of the electric field may be greater than or equal to $10^6$ V/cm.

The constant current formation layer 2210 may form a constant current between the drain region 2320 and the constant current formation layer 2210. The constant current may be a band-to-band (BTBT) current between the drain region 2320 and the constant current formation layer 2210. The constant current may be independent of a gate voltage applied to a gate electrode 2420. That is, the constant current may flow irrelevant to the gate voltage. When the tunnel field effect transistor 40 is an NMOS transistor device, the constant current may flow from the drain region 2320 to the substrate 2100 through the constant current formation layer 2210. When the tunnel field effect transistor 40 is a PMOS transistor device, the constant current may flow from the substrate 2100 to the drain region 2320 through the constant current formation layer 2210.

The pair of lower insulating films 2110 may be spaced apart from each other with the fin structure FS therebetween. The pair of lower insulating films 2110 may be arranged in the second direction DR2 parallel with the upper surface 2100u of the substrate 2100 and intersecting with the first direction DR1. The pair of lower insulating films 2110 may overlap a lower portion of the fin structure FS in the second direction DR2. The pair of lower insulating films 2110 may cover both lateral sides of the constant current formation layer 2210. The pair of lower insulating films 2110 may expose the source region 2310 and the drain region 2320. In other words, the source region 2310 and the drain region 2320 may protrude from the pair of lower insulating films 2110. The pair of lower insulating films 2110 may include an electric insulator. For example, the pair of lower insulating films 2110 may include $SiO_2$ or a high dielectric material (e.g., SiON, $HfO_2$, and $ZrO_2$).

The gate electrode 2420 may be provided on the fin structure FS and the pair of lower insulating films 2110. The gate electrode 2420 may extend in the second direction DR2 The gate electrode 2420 may intersect with the fin structure FS in a viewpoint of third direction DR3 intersecting with the first direction DR1 and the second direction DR2. The gate electrode 2420 may be provided on the channel layer 2220. The gate electrode 2420 may include an electrically conductive material. For example, the gate electrode 420 may include a doped semiconductor material, a metal, an alloy, or a combination thereof. For example, the gate electrode 420 may include doped polysilicon, tungsten (W), titanium nitride (TiN), or a combination thereof.

A gate insulating film 2410 may be provided between the gate electrode 2420 and the fin structure FS. For example, the gate insulating film 2410 may conformally cover an upper portion of the fin structure FS. The gate insulating film 2410 may electrically insulate the gate electrode 2420 and the fin structure FS from each other. The gate insulating film 2410 may separate the gate electrode 2420 and the fin structure FS. The gate insulating film 2410 may include an electric insulator. For example, the gate insulating film 2410 may include at least one material selected from a silicon oxide, a silicon nitride, a silicon oxynitride, an oxide/nitride/oxide (ONO), or a high-k dielectric. For example, the gate insulating film 2410 may include a material having a dielectric constant of about 10 to about 25. For example, the gate insulating film 2410 may include at least one material selected from a hafnium oxide (HfO), a hafnium silicon oxide (HfSiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicon oxide (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a strontium titanium oxide (SrTiO), a yttrium oxide (YO), an aluminum oxide (AlO), and a plumbum scandium tantalum oxide (PbScTaO).

According to the present disclosure, the tunnel field effect transistor 40 in which a constant current flows between the drain region 2320 and the substrate 2100 may be provided.

Figure 10:
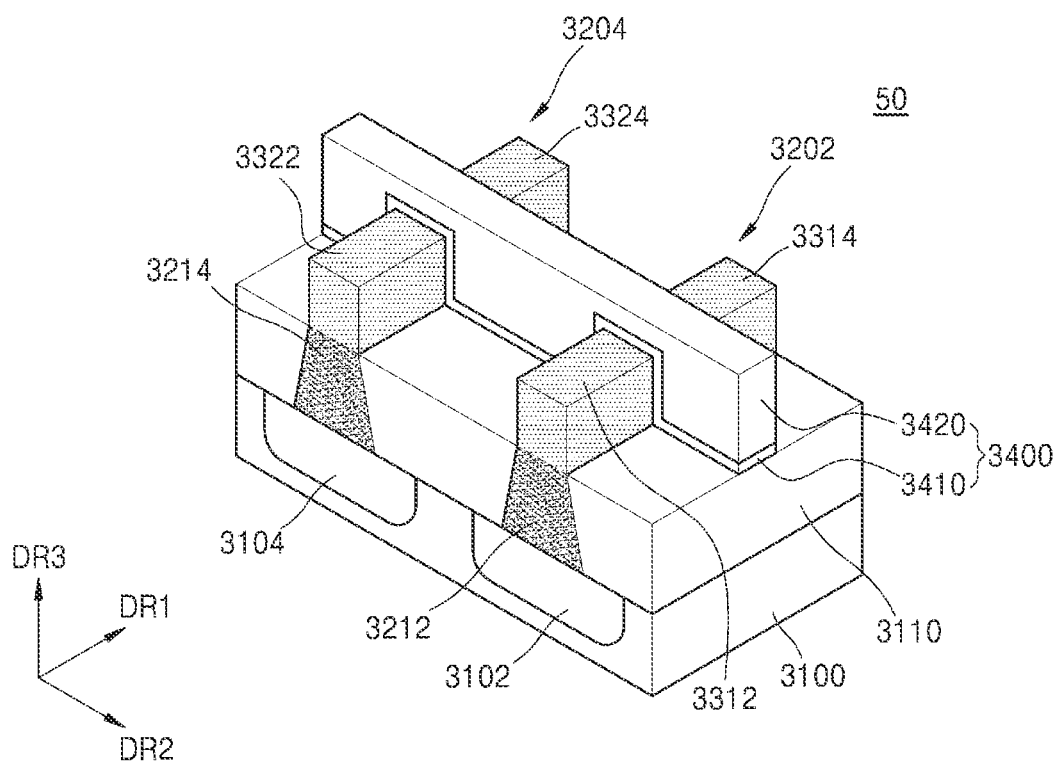
FIG. 10 is a perspective view of a ternary inverter according to an example embodiment.

FIG. 10 is a perspective view of a ternary inverter according to an example embodiment. For the sake of concise explanation, any description substantially identical to explanations made with reference to FIGS. 8 and 9 may be omitted.

With reference to FIG. 10, a ternary inverter 50 may be provided. The ternary inverter 50 may include a substrate 3100, a first well region 3102, a second well region 3104, a first fin structure 3202, a second fin structure 3204, a lower insulating film 3110, and a gate structure 3400. The substrate 3100 may be a semiconductor substrate. For example, the substrate 3100 may include silicon (Si). The substrate 3100 may be substantially identical to the substrate described with reference to FIGS. 8 and 9.

The first well region 3102 and the second well region 3104 may extend in the first direction DR1 parallel with an upper surface of the substrate 3100. The first well region 3102 and the second well region 3104 may be arranged in the second direction DR2 parallel with the upper surface of the substrate 3100. The first direction DR1 and the second direction DR2 may intersect with each other. A conductivity type of the first well region 3102 may be p-type. A conductivity type of the second well region 3104 may be n-type. For example, the first well region 3102 and the second well region 3104 may be formed by the ion implantation process.

The first fin structure 3202 and the second fin structure 3204 may be provided on the first well region 3102 and the second well region 3104, respectively. Each of the first fin structure 3202 and the second fin structure 3204 may be substantially identical to the fin structure FS described with reference to FIGS. 8 and 9 except for the features regarding the conductivity type. The first channel layer may be provided between the first source region 3312 and the first drain region 3314. A conductivity type of the first source region 3312, the first channel layer, and the first constant current formation layer 3212 may be p-type. A conductivity type of the first drain region 3314 may be n-type. The second channel layer may be provided between the second source region 3322 and the second drain region 3324. A conductivity type of the second source region 3322, the second channel layer, and the second constant current formation layer 3214 may be n-type. A conductivity type of the second drain region 3324 may be p-type.

The lower insulating films 3110 may be provided on both lateral sides of the first constant current formation fin 3212 and both lateral sides of the second constant current formation fin 3214. The both lateral sides of the first constant current formation fin 3212 and the both lateral sides of the second constant current formation fin 3214 may extend in the first direction DR1. The lower insulating films 3110 may include an electric insulator. For example, the lower insulating films 3110 may include $SiO_2$ or a high dielectric material (e.g., SiON, $HfO_2$, and $ZrO_2$).

The gate structure 3400 may be provided on the first fin structure 3202 and the second fin structure 3204. The gate structure 3400 may include a gate insulating film 3410 and a gate electrode 3420 stacked in this order. The gate insulating film 3410 and the gate electrode 3420 may be substantially identical to the gate insulating film 2410 and the gate electrode 2420 described with reference to FIGS. 8 and 9, respectively. The gate structure 3400 may intersect with the first fin structure 3202 and the second fin structure 3204. For example, the gate structure 400 may extend in the second direction DR2. The gate structure 400 may extend along surfaces of the first fin structure 3202 and the second fin structure 3204 exposed on the lower insulating film 3110 and the lower insulating films 3110.

According to the present disclosure, the ternary inverter 50 including tunnel field effect transistors may be provided. The ternary inverter 50 may be substantially identical to the ternary inverter 20 described with reference to FIG. 4. The first well region 3102, the first fin structure 3202, and the gate structure 3400 on the first fin structure 3202 may be an NMOS tunnel field effect transistor. The second well region 3104, the second fin structure 3204, and the gate structure 3400 on the second fin structure 3204 may be a PMOS tunnel field effect transistor.

The driving voltage $V_{DD}$ may be applied to the second well region 3104 and the second source region 3322. The ground voltage may be applied to the first well region 3102 and the first source region 3312. The input voltage Vin may be applied to the gate electrode 3420. The second drain region 3324 and the first drain region 3314 may be electrically connected to each other. A voltage of the second drain region 3324 and the first drain region 3314 may be the output voltage Vout of the ternary inverter 50.

A constant current (i.e., a constant current of the PMOS tunnel field effect transistor) may flow from the second well region 3104 to the second drain region 3324. A constant current (i.e., a constant current of the NMOS tunnel field effect transistor) may flow from the first drain region 3314 to the first well region 3102. The constant currents may be independent of the input voltage Vin (i.e., gate voltage).

The ternary inverter 50 may have a drive mechanism substantially identical to that of the ternary inverter 20 described with reference to FIG. 7.

As described with reference to FIG. 7, the output voltage Vout of the ternary inverter 50 may be 0 V (the "0" state), a voltage between the driving voltage $V_{DD}$ and 0 V (the "1" state), or the driving voltage $V_{DD}$ (the "2" state) according to the input voltage Vin, According to the present disclosure, the ternary inverter 50 having three different states according to the input voltage Vin may be provided.

Figure 11:
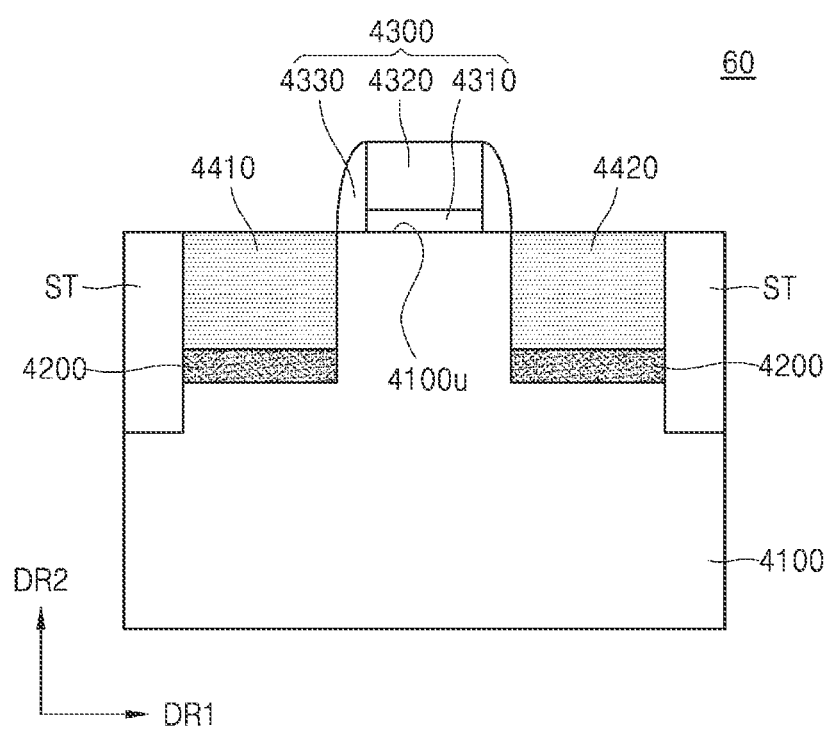
FIG. 11 is a cross-sectional view of a tunnel field effect transistor according to example embodiments.

FIG. 11 is a cross-sectional view of a tunnel field effect transistor according to example embodiments.

With reference to FIG. 11, a tunnel field effect transistor 60 may be provided. The tunnel field effect transistor 60 may include a substrate 4100, a pair of device isolation regions ST, a source region 4410, a drain region 4420, a pair of constant current formation regions 4200, and a gate structure 4300.

The substrate 4100 may be a semiconductor substrate. For example, the substrate 4100 may include silicon (Si). The substrate 4100 may have the first conductivity type. For example, the first conductivity type may be n-type or p-type.

The pair of device isolation regions ST may be provided at an upper portion of the substrate 4100. The pair of device isolation regions ST may be spaced apart from each other in the first direction DR1 parallel with an upper surface 4100*u* of the substrate 4100. The pair of device isolation regions ST may extend in the second direction DR2 perpendicular to the upper surface 4100*u* of the substrate 4100. The pair of device isolation regions ST may include an electric insulator. For example, the pair of device isolation regions ST may include $SiO_2$ or a high dielectric material (e.g., SiON, $HfO_2$, and $ZrO_2$).

The source region 4410 and the drain region 4420 may be provided at the upper portion of the substrate 4100. The source region 4410 and the drain region 4420 may be spaced apart from each other in the first direction DR1. The source region 4410 may have the first conductivity type. The drain region 4420 may have the second conductivity type different from the first conductivity type. For example, when the conductivity type of the source region 4410 is n-type, the conductivity type of the drain region 4420 may be p-type. For example, when the conductivity type of the source region 4410 is p-type, the conductivity type of the drain region 4420 may be n-type.

The pair of constant current formation regions 4200 may be respectively provided on a bottom surface of the source region 4410 and a bottom surface of the drain region 4420. The pair of constant current formation regions 4200 may overlap the source region 4410 and the drain region 4420, respectively in the second direction DR2. The pair of constant current formation regions 4200 may be electrically connected to the source region 4410 and the drain region 4420. For example, the pair of constant current formation regions 4200 may be in direct contact with the source region 4410 and the drain region 4420. The pair of constant current formation regions 4200 may be spaced apart from each other in the first direction DR1. The pair of constant current formation regions 4200 may have the first conductivity type. A doping concentration of the pair of constant current formation regions 4200 may be higher than a doping concentration of the substrate 4100. For example, the doping concentration of the pair of constant current formation regions 4200 may be greater than or equal to $3 \times 10^{13}$ $cm^{-3}$. An electric field may be formed between the pair of constant current formation regions 4200 and the drain region 4420. For example, an intensity of the electric field may be greater than or equal to $10^6$ V/cm.

The gate structure 4300 may be provided on the substrate 4100. The gate structure 4300 may include a gate insulating film 4310, a gate electrode 4320, and a pair of spacers 4330. The gate electrode 4320 may include an electrically conductive material. For example, the gate electrode 4320 may include a doped semiconductor material, a metal, an alloy, or a combination thereof. For example, the gate electrode 4320 may include doped polysilicon, tungsten (W), titanium nitride (TiN), or a combination thereof.

The gate insulating film 4310 may be provided between the gate electrode 4320 and the substrate 4100. The gate insulating film 4310 may electrically insulate the gate electrode 4320 and the substrate 4100 from each other. The gate insulating film 4310 may include an electric insulator. For example, the gate insulating film 4310 may include at least one material selected from a silicon oxide, a silicon nitride, a silicon oxynitride, an oxide/nitride/oxide (ONO), or a high-k dielectric. For example, the gate insulating film 4310 may include a material having a dielectric constant of about 10 to about 25. For example, the gate insulating film 4310 may include at least one material selected from a hafnium oxide (HfO), a hafnium silicon oxide (HISiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicon oxide (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a strontium titanium oxide (SrTiO), a yttrium oxide (YO), an aluminum oxide (AlO), and a plumbum scandium tantalum oxide (PbScTaO).

The pair of spacers 4330 may be provided on each of both lateral walls of the gate electrode 4320. The pair of spacers 4330 may extend onto each of the both lateral walls of the gate insulating film 4310. The pair of spacers 4330 may include an electric insulator. For example, the pair of spacers 4330 may include $SiO_2$ or a high dielectric material (e.g., SiON, $HfO_2$, and $ZrO_2$).

In one embodiment, a threshold voltage of the tunnel field effect transistor 60 may be adjusted according to a doping concentration of the substrate 4100 and/or a work function of the gate electrode 4320. For example, the work function of the gate electrode 4320 may be adjusted by a material of the gate electrode 4320 or an additional work function adjustment film (not shown). For example, the additional work function adjustment film may be arranged between the gate insulating film 4310 and the substrate 4100.

The constant current formation region 4200 immediately adjacent to the drain region 4420 may form a constant current between the drain region 4420 and the constant current formation region 4200 immediately adjacent thereto. The constant current may be a BTBT current between the drain region 4420 and the constant current formation region 4200 directly adjacent thereto. The constant current may be independent of a gate voltage applied to the gate electrode 4320. That is, the constant current may flow irrelevant to the gate voltage. When the tunnel field effect transistor 60 is an NMOS transistor, the constant current may flow from the drain region 4420 to the substrate 4100 through the constant current formation region 4200 directly adjacent to the drain region 4420. When the tunnel field effect transistor 60 is a PMOS transistor, the constant current may flow from the substrate 4100 to the drain region 4420 through the constant current formation region 4200 directly adjacent to the drain region 4420.

According to the present disclosure, the tunnel field effect transistor 60 in which a constant current is formed between the drain region 4320 and the constant current formation region 4200 directly adjacent thereto may be provided.

Figure 12:
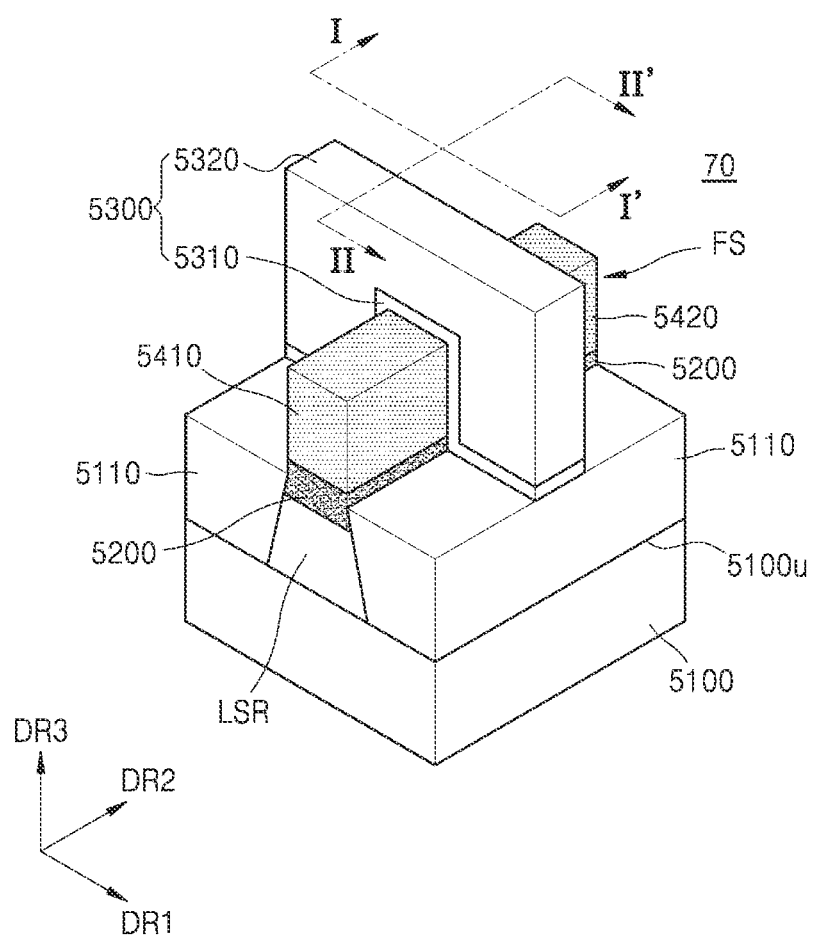
FIG. 12 is a perspective view of a transistor according to an example embodiment.
Figure 13:
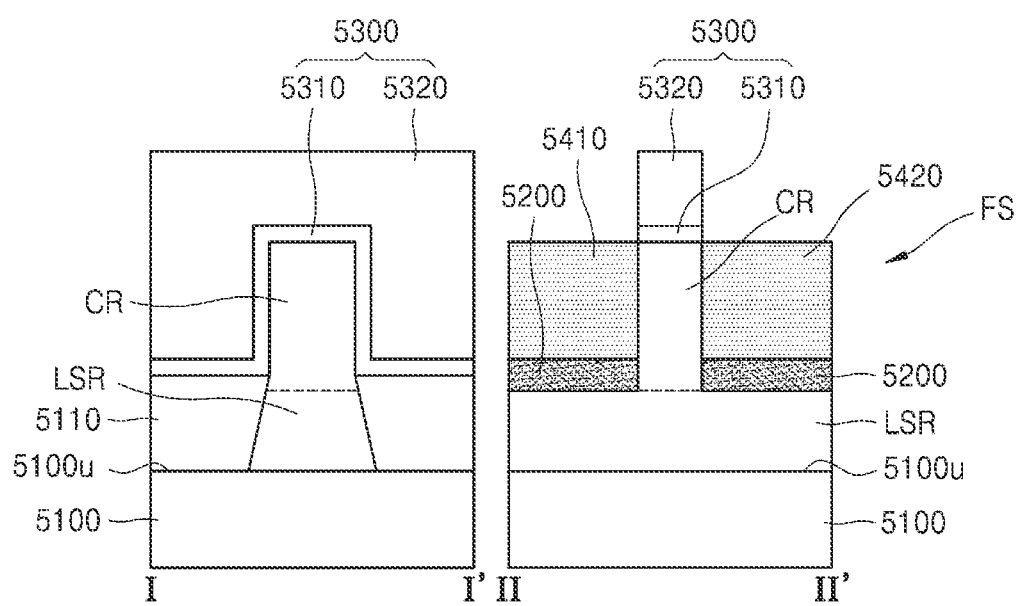
FIG. 13 are cross-sectional views taken along the line I-I' and the II-II' line in FIG. 12.

FIG. 12 is a perspective view of a transistor according to an example embodiment. FIG. 13 are cross-sectional views taken along the I-I' line and the II-II' line in FIG. 12. For the sake of concise explanation, any description substantially identical to explanations made with reference to FIGS. 8 and 9 may be omitted.

With reference to FIGS. 12 and 13, a tunnel field effect transistor 70 may be provided. The tunnel field effect transistor 70 may include a substrate 5100, a fin structure FS, a pair of lower insulating films 5110, and a gate structure 5300.

The substrate 5100 may be a semiconductor substrate. For example, the substrate 5100 may include silicon (Si). The substrate 5100 may have the first conductivity type. For example, the first conductivity type may be n-type or p-type.

The fin structure FS may be provided on the substrate 5100. The fin structure FS may include a lower semiconductor region LSR, a pair of constant current formation regions 5200, a source region 5410, a drain region 5420, and a channel region CR. The lower semiconductor region LSR may be provided at a lower portion of the fin structure FS. The lower semiconductor region LSR may extend in the second direction DR2 parallel with an upper surface 5100u of the substrate 5100. The lower semiconductor region LSR may protrude from the upper surface 5100u of the substrate 5100. The lower semiconductor region LSR may include silicon (Si). The lower semiconductor region LSR may have the first conductivity type.

The pair of constant current formation regions 5200 may be provided on the lower semiconductor region LSR. The pair of constant current formation regions 5200 may be spaced apart from each other with the gate electrode 5300 therebetween. For example, the pair of constant current formation regions 5200 may be spaced apart from each other in the second direction DR2. For example, the pair of constant current formation regions 5200 may include silicon (Si). The pair of constant current formation regions 5200 may have the first conductivity type. A doping concentration of the pair of constant current formation regions 5200 may be higher than a doping concentration of the substrate 5100 and the lower semiconductor region LSR. For example, the doping concentration of the pair of constant current formation regions 5200 may be greater than or equal to $3 \times 10^{18}$ $cm^{-3}$.

The source region 5410 and the drain region 5420 may be respectively provided on the pair of constant current formation regions 5200. The source region 5410 and the drain region 5420 may be spaced apart from each other in the second direction DR2. The source region 5410 may have the first conductivity type. A doping concentration of the source region 5420 may be higher than a doping concentration of the pair of constant current formation regions 5200. The drain region 5420 may have the second conductivity type different from the first conductivity type. For example, when the conductivity type of the source region 5410 is n-type, the conductivity type of the drain region 5420 may be p-type. For example, when the conductivity type of the source region 5410 is p-type, the conductivity type of the drain region 5420 may be n-type.

The source region 5410 and the drain region 5420 may respectively be electrically connected to the pair of constant current formation regions 5200. For example, the source region 5410 and the drain region 5420 may be in direct contact with the pair of constant current formation regions 5200. An electric field may be formed between the pair of constant current formation regions 5200 and the drain region 5420. For example, an intensity of the electric field may be greater than or equal to $10^6$ V/cm.

The channel region CR may be provided on the lower semiconductor region LSR. The channel region CR may extend from the lower semiconductor region LSR to a region between the source region 5410 and the drain region 5420. The channel region CR may be provided between the pair of constant current formation regions 5200 and between the source region 5410 and the drain region 5420. The channel region CR may include silicon (Si). The channel region CR may have the first conductivity type. A doping concentration of the channel region CR may be lower than a doping concentration of the pair of constant current formation regions 5200. For example, the doping concentration of the channel region CR may be substantially identical to a doping concentration of the lower semiconductor region LSR. The channel region CR may be a region in which a channel of the tunnel field effect transistor 70 is formed.

The pair of lower insulating films 5110 may be spaced apart from each other with the fin structure FS therebetween. For example, the pair of lower insulating films 5110 may be spaced apart from each other in the first direction DR1 parallel with the upper surface 5100u of the substrate 5100 and intersecting with the second direction DR2. The pair of lower insulating films 5110 may overlap the lower semiconductor region LSR in the first direction DR1. The pair of lower insulating films 5110 may include an electric insulator. For example, the pair of lower insulating films 5110 may include $SiO_2$ or a high dielectric material (e.g., SiON, $HfO_2$, and $ZrO_2$).

The gate structure 5300 may be provided on the fin structure FS and the pair of lower insulating films 5110. The gate structure 5300 may include a gate insulating film 5310 and a gate electrode 5320 stacked in this order. The gate structure 5300 may extend in the first direction DR1. The gate structure 5300 may overlap the channel region CR in the third direction DR3. The gate structure 5300 may extend along a surface of the fin structure FS exposed on the pair of lower insulating films 5110 and the pair of lower insulating films 5110. The gate insulating film 5310 may include an electric insulator. For example, the gate insulating film 5310 may include at least one material selected from a silicon oxide, a silicon nitride, a silicon oxynitride, an oxide/nitride/oxide (ONO), or a high-k dielectric. For example, the gate insulating film 5310 may include a material having a dielectric constant of about 10 to about 25. For example, the gate insulating film 5310 may include at least one material selected from a hafnium oxide (HfO), a hafnium silicon oxide (HfSiO), a hafnium oxynitride (HfON), a hafnium silicon oxynitride (HfSiON), a lanthanum oxide (LaO), a lanthanum aluminum oxide (LaAlO), a zirconium oxide (ZrO), a zirconium silicon oxide (ZrSiO), a zirconium oxynitride (ZrON), a zirconium silicon oxynitride (ZrSiON), a tantalum oxide (TaO), a titanium oxide (TiO), a barium strontium titanium oxide (BaSrTiO), a barium titanium oxide (BaTiO), a strontium titanium oxide (SrTiO), a yttrium oxide (YO), an aluminum oxide (AlO), and a plumbum scandium tantalum oxide (PbScTaO). The gate electrode 5320 may include an electrically conductive material. For example, the gate electrode 5320 may include a doped semiconductor material, a metal, an alloy, or a combination thereof. For example, the gate electrode 5320 may include doped polysilicon, tungsten (W), titanium nitride (TiN), or a combination thereof.

In one embodiment, a threshold voltage of the tunnel field effect transistor 70 may be adjusted according to a doping concentration of the channel region CR and/or a work function of the gate electrode 5320. For example, the work function of the gate electrode 5320 may be adjusted by a material of the gate electrode 5320 or an additional work function adjustment film (not shown). For example, the additional work function adjustment film may be arranged between the gate insulating film 5310 and the channel region CR.

The constant current formation region 5200 immediately adjacent to the drain region 5420 may form a constant current between the drain region 5420 and the constant current formation region 5200. The constant current may be a BTBT current between the drain region 5420 and the constant current formation region 5200 directly adjacent thereto. The constant current may be independent of a gate voltage applied to the gate electrode 5320. That is, the constant current may flow irrelevant to the gate voltage. When the tunnel field effect transistor 70 is an NMOS transistor, the constant current may flow from the drain region 5420 to the lower semiconductor region LSR and the substrate 5100 through the constant current formation region 5200 directly adjacent to the drain region 5420. When the tunnel field effect transistor 70 is a PMOS transistor, the constant current may flow from the substrate 5100 to the drain region 5420 through the lower semiconductor region LSR and the constant current formation region 5200 directly adjacent to the drain region 5420.

According to the present disclosure, the tunnel field effect transistor 70 in which a constant current flows between the drain region 5420 and the constant current formation region 5200 directly adjacent thereto may be provided.

The descriptions of embodiments of the technical ideas according to the present disclosure are intended to provide examples to explain the technical ideas of the present disclosure. Accordingly, the technical ideas of the present disclosure are not limited to the embodiments described above, and various modifications and amendments may be made by a person skilled in the art by combining the embodiments, etc., within the scope of the technical ideas of the present disclosure.

The invention claimed is:

1. A tunnel field effect transistor comprising:
a constant current formation layer;
a source region and a drain region provided on the constant current formation layer;
a channel layer provided between the source region and the drain region;
a gate electrode provided on the channel layer; and
a gate insulating film provided between the gate electrode and the channel layer,
wherein the source region and the drain region have different conductivity types, and
the constant current formation layer forms a constant current between the drain region and the constant current formation layer.

2. The tunnel field effect transistor of claim 1, wherein the constant current is independent of a gate voltage applied to the gate electrode.

3. The tunnel field effect transistor of claim 1, wherein the constant current formation layer and the source region have a first conductivity type, and
the drain electrode has a second conductivity type.

4. The tunnel field effect transistor of claim 1, wherein a doping concentration of the constant current formation layer is higher than a doping concentration of the channel layer.

5. The tunnel field effect transistor of claim 4, wherein the doping concentration of the constant current formation layer is greater than or equal to $3\times10^{18}$ cm$^3$.

6. The tunnel field effect transistor of claim 1, wherein an electric field is formed between the drain region and the constant current formation layer, and
an intensity of the electric field is greater than or equal to $10^5$ V/cm.

7. The tunnel field effect transistor of claim 1, wherein the constant current formation layer is arranged adjacent to the drain region and is electrically connected to the drain region.

8. The tunnel field effect transistor of claim 7, wherein the constant current formation layer extends to a region adjacent to the source region.

9. A tunnel field effect transistor comprising:
a fin structure extending in a first direction;
a gate electrode extending in a second direction intersecting with the first direction; and
a gate insulating film provided between the fin structure and the gate electrode,
wherein the fin structure comprises a constant current formation layer provided at a lower portion of the fin structure and a source region and a drain region provided on the constant current formation layer,
the source region and the drain region have different conductivity types, and
the constant current formation layer forms a constant current between the drain region and the constant current formation layer.

10. The tunnel field effect transistor of claim 9, wherein the fin structure overlaps the gate electrode in the second direction.

11. The tunnel field effect transistor of claim 9, wherein the constant current is independent of a gate voltage applied to the gate electrode.

12. The tunnel field effect transistor of claim 9, wherein the constant current formation layer and the source region have a first conductivity type, and
the drain electrode has a second conductivity type.

13. The tunnel field effect transistor of claim 9, wherein the fin structure further includes a channel layer provided between the source region and the drain region, and a doping concentration of the constant current formation layer is higher than a doping concentration of the channel layer.

14. The tunnel field effect transistor of claim 13, wherein the doping concentration of the constant current formation layer is greater than or equal to $3 \times 10^{18}$ cm$^{-3}$.

15. The tunnel field effect transistor of claim 9, wherein an electric field is formed between the drain region and the constant current formation layer, and
an intensity of the electric field is greater than or equal to $10^5$ V/cm.

16. The tunnel field effect transistor of claim 9, wherein the constant current formation layer is arranged adjacent to the drain region and is electrically connected to the drain region.

17. The tunnel field effect transistor of claim 16, wherein the constant current formation layer extends in the first direction, and overlaps the source region and the drain region in a third direction intersecting with the first direction and the second direction.

18. A ternary inverter comprising:
a first well region and a second well region, a first constant current formation layer and a second constant current formation layer provided on the first well region and the second well region, respectively, a first source region provided on the first constant current formation layer, a first channel layer, a first drain region, a second source region provided on the second constant current formation layer, a second channel layer, a second drain region, and a first gate electrode and a second gate electrode provided on the first channel layer and the second channel layer, respectively,
wherein the first source region and the first drain region have different conductivity types, and the second source region and the second drain region have different conductivity types,
wherein the first constant current formation layer forms a first constant current between the first drain region and the first constant current formation layer, and the second constant current formation layer forms a second constant current between the second drain region and the second constant current formation layer.

19. The ternary inverter of claim 18, wherein each of the first constant current and the second constant current is independent of gate voltages applied to the first gate electrode and the second gate electrode, respectively.

20. The ternary inverter of claim 18, wherein the first constant current formation layer and the first source region have a first conductivity type,
the first drain electrode has a second conductivity type different from the first conductivity type,
the second constant current formation layer and the second source region have the second conductivity type, and
the second drain electrode has the first conductivity type.

* * * * *